United States Patent
Yang et al.

(10) Patent No.: US 8,119,432 B2
(45) Date of Patent: Feb. 21, 2012

(54) METHOD AND APPARATUS FOR MEMS OSCILLATOR

(75) Inventors: Xiao Yang, Cupertino, CA (US); Dongmin Chen, Saratoga, CA (US); Ye Wang, Cupertino, CA (US); Justin Payne, San Jose, CA (US); Yuxiang Wang, Palo Alto, CA (US); Wook Ji, San Jose, CA (US)

(73) Assignee: Miradia Inc., Santa Clara, CA (US)

( * ) Notice: Subject to any disclaimer, the term of this patent is extended or adjusted under 35 U.S.C. 154(b) by 7 days.

(21) Appl. No.: 12/944,982

(22) Filed: Nov. 12, 2010

(65) Prior Publication Data

US 2011/0059565 A1 Mar. 10, 2011

Related U.S. Application Data

(62) Division of application No. 11/950,373, filed on Dec. 4, 2007, now Pat. No. 7,863,697.

(60) Provisional application No. 60/868,710, filed on Dec. 5, 2006.

(51) Int. Cl.
G04C 3/08 (2006.01)
H01L 21/00 (2006.01)
(52) U.S. Cl. .......... 438/52; 438/50; 331/154; 331/116 M
(58) Field of Classification Search .............. 438/50, 438/52; 331/154, 158, 116 R, 116 M
See application file for complete search history.

(56) References Cited

U.S. PATENT DOCUMENTS

| 2002/0072163 A1* | 6/2002 | Wong et al. | 438/200 |
| 2004/0097004 A1* | 5/2004 | Pogge et al. | 438/52 |

* cited by examiner

*Primary Examiner* — Victor A Mandala
*Assistant Examiner* — Scott Stowe
(74) *Attorney, Agent, or Firm* — Kilpatrick Townsend & Stockton LLP

(57) ABSTRACT

A resonator includes a CMOS substrate having a first electrode and a second electrode. The CMOS substrate is configured to provide one or more control signals to the first electrode. The resonator also includes a resonator structure including a silicon material layer. The resonator structure is coupled to the CMOS substrate and configured to resonate in response to the one or more control signals.

10 Claims, 12 Drawing Sheets

METHOD AND APPARATUS FOR MEMS OSCILLATOR

CROSS-REFERENCES TO RELATED APPLICATIONS

The present application is a division of U.S. patent application Ser. No. 11/950,373 filed on Dec. 4, 2007, which claims benefit under 35 U.S.C. §119(e) of U.S. Provisional Patent Application No. 60/868,710, filed Dec. 5, 2006, the disclosures of which are incorporated by reference herein in their entirety for all purposes.

BACKGROUND OF THE INVENTION

The present invention related generally to oscillators and resonators. In particular, the invention provides a method and apparatus for fabricating and operating a resonator coupled to a CMOS substrate. More particularly, one or more single crystal silicon oscillator structures are controlled by a CMOS substrate in an embodiment. In a specific embodiment, at least a portion of the resonator structure is fabricated from a single crystal layer joined to the CMOS substrate through a wafer-level layer transfer process. Other embodiments of the present invention have a much broader range of applicability.

Quartz resonators have been used for oscillators and/or sensing devices. For example, quartz resonators are widely used in oscillators found in watches and other applications that benefit from small size, low cost, and ruggedness. A quartz resonator operates by resonating in response to a stimulus, which may be a physical event, such as acceleration, force, or pressure. Alternatively, the quartz resonator may resonate in response to an electrical signal, thereby acting as a frequency source.

In addition to quartz resonators, microelectromechanical systems (MEMS) have been utilized to fabricate structures implementing resonator designs. As an example, silicon materials, which are characterized by excellent mechanical strength and high material quality, have been used in various MEMS resonators. Silicon is an attractive material for MEMS resonators, not only due to its favorable material properties, but as a result of benefits gained by leveraging existing semiconductor processing techniques. Based on processing techniques developed by the integrated circuit industry, fabrication processes for silicon-based MEMS resonators are generally well developed.

Despite the developments made in the field of MEMS resonators, there is a need in the art for improved methods and systems for silicon-based resonators and oscillators.

SUMMARY OF THE INVENTION

According to the present invention, techniques for oscillators and resonators are provided. In particular, the invention provides a method and apparatus for fabricating and operating a silicon-based resonator coupled to a CMOS substrate. More particularly, one or more single crystal silicon resonator structures are controlled by a CMOS substrate in an embodiment. In a specific embodiment, at least a portion of the resonator structure is fabricated from a single crystal layer joined to the CMOS substrate through a wafer-level layer transfer process. Other embodiments of the present invention have a much broader range of applicability.

According to an embodiment of the present invention, a resonator is provided. The resonator includes a CMOS substrate having a first electrode and a second electrode. The CMOS substrate is configured to provide one or more control signals to the first electrode. The resonator also includes a resonator structure including a silicon material layer. The resonator structure is coupled to the CMOS substrate and configured to resonate in response to the one or more control signals.

According to another embodiment, a resonator system is provided. The resonator system includes a CMOS substrate having a first electrode adapted to provide a drive signal and a second electrode adapted to provide a sense signal. The resonator system also includes a resonator structure coupled to the CMOS substrate. The resonator structure includes a hinge mechanically coupled to the CMOS substrate and a silicon resonator including a single crystal silicon layer. The silicon resonator is mechanically coupled to the hinge. In a particular embodiment, the hinge includes the single crystal silicon layer.

According to yet another embodiment of the present invention, a method of fabricating a resonator device is provided. The method includes providing a CMOS substrate including at least one electrode and joining a resonator substrate to the CMOS substrate. The method also includes removing a portion of the resonator substrate to provide a resonator layer and thereafter patterning the resonator layer to form the resonator. In a specific embodiment, the method further includes depositing a dielectric layer on the CMOS substrate and performing a CMP process to form a bonding surface prior to joining the resonator substrate to the CMOS substrate.

Numerous benefits are achieved using the present invention over conventional techniques. Some embodiments provide methods and systems that include one or more resonators with long lifetimes and high reliability. Other embodiments provide oscillator systems characterized by high levels of accuracy. In a particular embodiment, a resonator structure is fabricated in a single crystal silicon layer formed using wafer-level layer transfer processes. Depending upon the embodiment, one or more of these benefits may exist. These and other benefits have been described throughout the present specification and more particularly below. Various additional objects, features, and advantages of the present invention can be more fully appreciated with reference to the detailed description and accompanying drawings that follow.

DETAILED DESCRIPTION OF SPECIFIC EMBODIMENTS

Embodiments of the present invention provide MEMS structures useful for timing device applications. Combining MEMS technology with CMOS circuitry, it is possible to fabricate oscillator and resonator structures useful in a wide variety of applications. The examples described herein are provided merely for purposes of illustration and are not intended to limit embodiments of the present invention.

Figure 1:
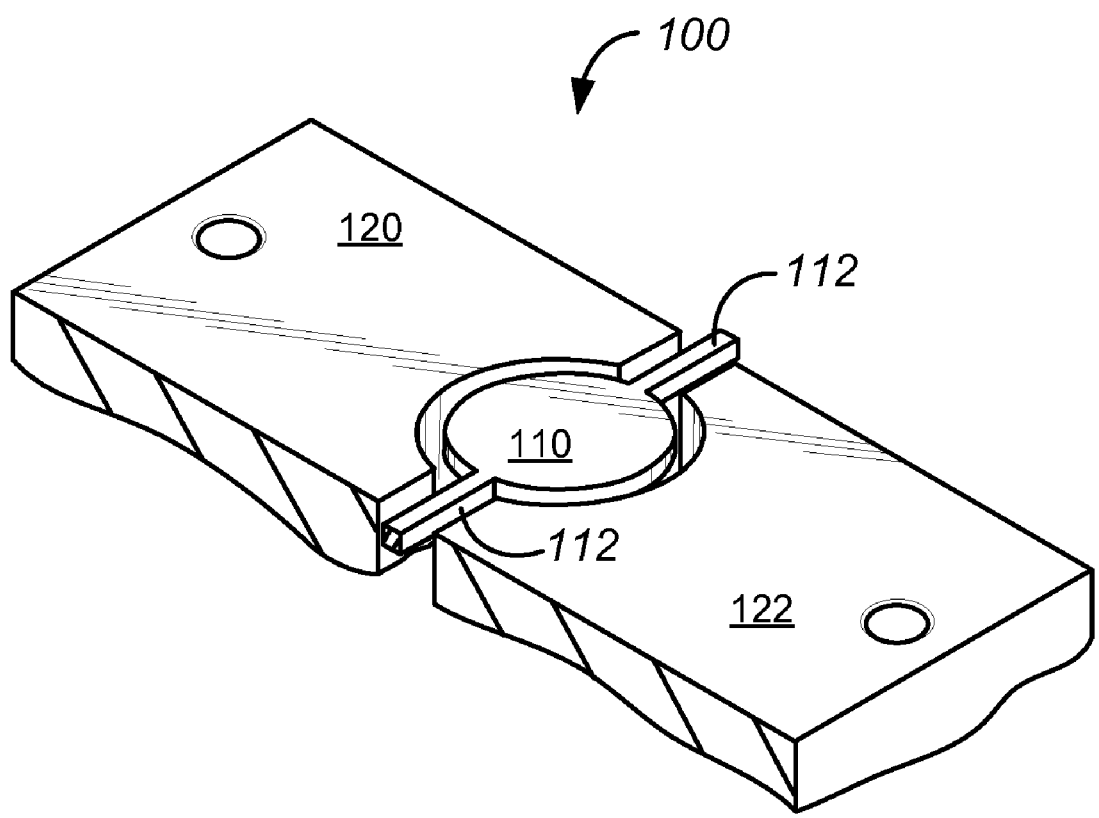
FIG. 1 is a simplified perspective illustration of a portion of a MEMS resonator according to an embodiment of the present invention.

FIG. 1 is a simplified perspective illustration of a portion of a MEMS resonator according to an embodiment of the present invention. The MEMS resonator 100 includes a moveable structure 110 that is mechanically coupled to one or more flexible members 112. The moveable structure 110 is mechanically responsive to electrical signals provided using drive electrode 120. In turn, sense electrode 122 is electrically responsive to mechanical vibrations of the moveable structure 110. Although not illustrated in FIG. 1, a CMOS substrate provides mechanical support for resonator structure 120. Moreover, the CMOS substrate provides electrical inputs to the resonator structure as well as receives electrical outputs from the resonator structure. Additional discussion related to the CMOS substrate is provided throughout the present specification and more particularly below.

Although the thickness of the moveable member 110 and the flexible members 112 is illustrated as less than the thickness of the electrodes 120/122 in FIG. 1, this is not required by embodiments of the present invention. In particular embodiments described herein, the moveable member 110, the flexible members, 112, and the electrodes 120/122 are fabricated from a single layer, thereby providing for structures having the same thickness. In other embodiments, additional layers that are deposited or otherwise formed result in structures with different thicknesses as appropriate to the particular applications. The shape of the moveable plate is illustrated as a circle merely by way of example. In other embodiments, other shapes are utilized as appropriate to the particular oscillator application. One of ordinary skill in the art would recognize many variations, modifications, and alternatives.

Figure 2:
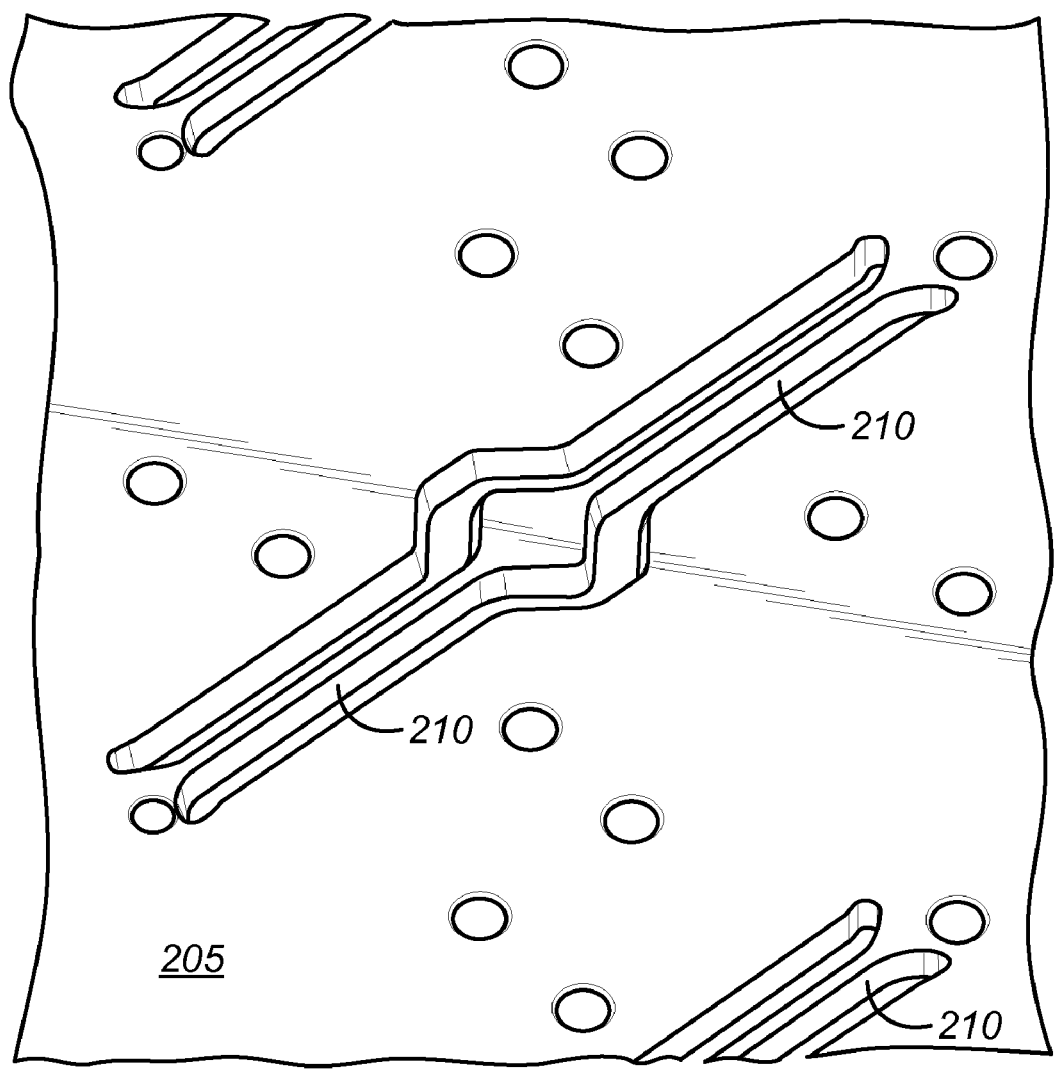
FIG. 2 is a simplified perspective illustration of a silicon beam resonator according to an embodiment of the present invention.

FIG. 2 is a simplified perspective illustration of a silicon beam resonator according to an embodiment of the present invention. Referring to FIG. 2, a number of resonator structures 210 are fabricated in one or more layers of material 205. In the embodiment illustrated in FIG. 2, the resonator structure 210 is fabricated from silicon material (e.g., single crystal silicon) with one or more conductive layers deposited thereon. The shape and dimensions of the resonator structure and the distances between the resonator structure and other components provided in or on layer 205 are selected to provide for oscillations in predetermined frequency ranges depending on the particular applications. Utilizing well-developed semiconductor processing techniques, high levels of control over such structures and dimensions are readily provided and utilized in various embodiments of the present invention. Although drive and sense electrodes are not illustrated in FIG. 2, such electrodes are provided in or on layer 205 in order to provide for interaction between the resonator structure 210.

Figure 3A:
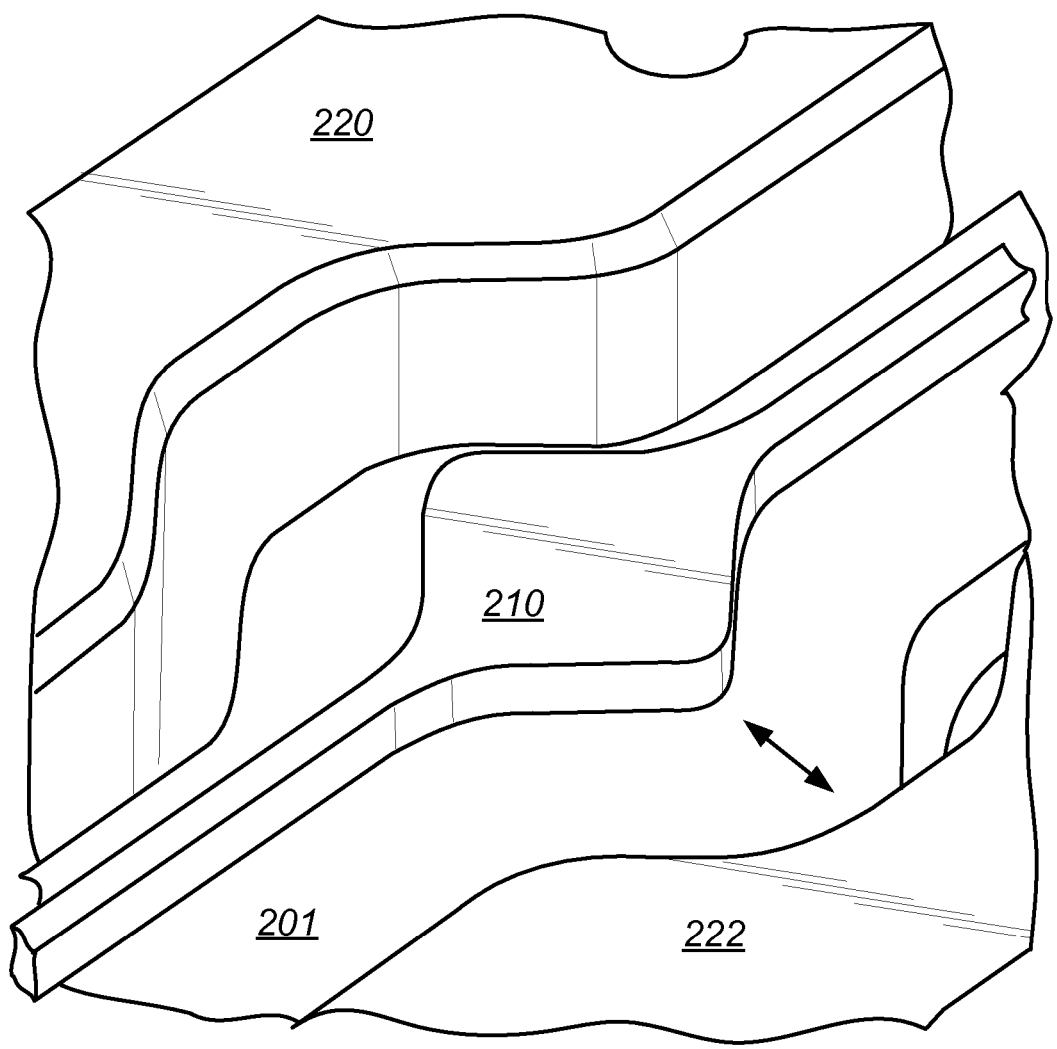
FIG. 3A is a simplified illustration of a portion of the silicon beam resonator illustrated in FIG. 2 operating in a lateral resonant mode.

FIG. 3A is a simplified illustration of a portion of the silicon beam resonator illustrated in FIG. 2 operating in a lateral resonant mode. As illustrated in FIG. 3A, the moveable member oscillates in the plane of the layers forming first electrode 220, first electrode 222 and the silicon beam resonator 210. Motion in this plane is illustrated by the horizontal arrow between the silicon beam resonator and the second electrode 222. The electrodes 220 and 222, which may be drive and sense electrodes, respectively, are electrically isolated from the silicon beam resonator 210.

In an exemplary embodiment of the present invention, the thickness of the silicon resonator structure is about 0.2 µm, although other embodiments utilize layers that are thicker or thinner depending on the particular application. In a particular embodiment, the silicon resonator is fabricated from a layer of single crystal silicon as described more fully below. The dimensions and shape of the single crystal silicon beam supported above the CMOS substrate 201 as well as the gaps between various components are selected to provide a predetermined oscillatory behavior depending on the application. The shape illustrated in FIGS. 2, 3A, 3B, and 3C is merely an example of a possible structure and is not intended to limit the scope of embodiments of the present invention.

Figure 3B:
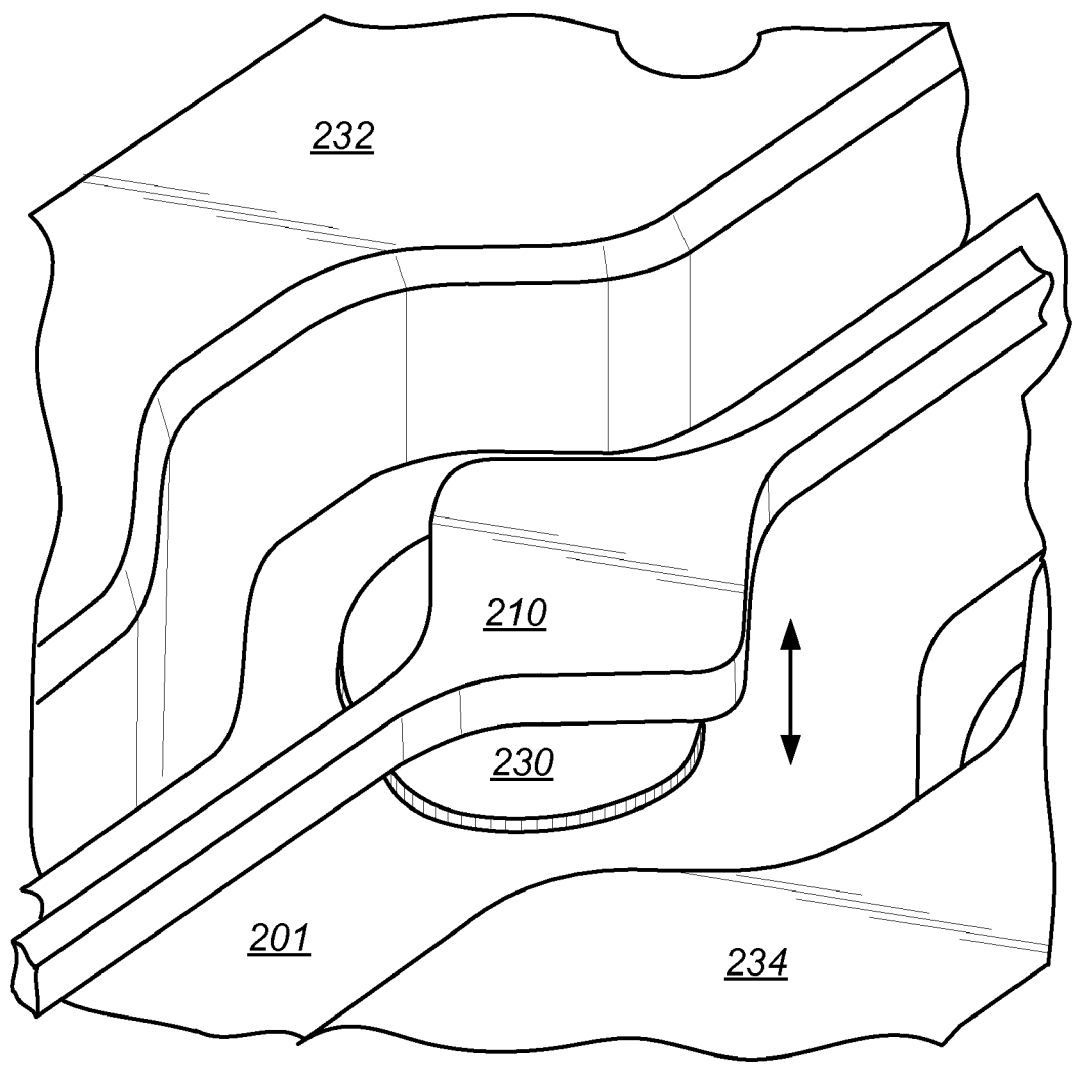
FIG. 3B is a simplified illustration of a portion of the silicon beam resonator illustrated in FIG. 2 operating in a vertical resonant mode.

FIG. 3B is a simplified illustration of a portion of the silicon beam resonator illustrated in FIG. 2 operating in a vertical resonant mode. In the embodiment illustrated in FIG. 3B, electrode 230, which is typically the drive electrode, is positioned on or extends from surface 201 in a position under the resonator structure 210. The electrode 230 may be smaller in size than the resonator structure 210 or extend laterally beyond the footprint of the resonator structure depending on the particular design. This first electrode 230 enables a voltage to be established in a vertical direction and thereby provides for resonant vertical oscillation of the resonator structure as illustrated by the vertical arrow. The motion of the resonator structure can be sensed using the electrode 232 and 234 as FIG. 3B as the motion of the resonator structure 210 in the vertical direction results in a change in the capacitance across the gap between the electrodes 232 and 234 and the resonator structure 210. One of ordinary skill in the art would recognize many variations, modifications, and alternatives.

Figure 3C:
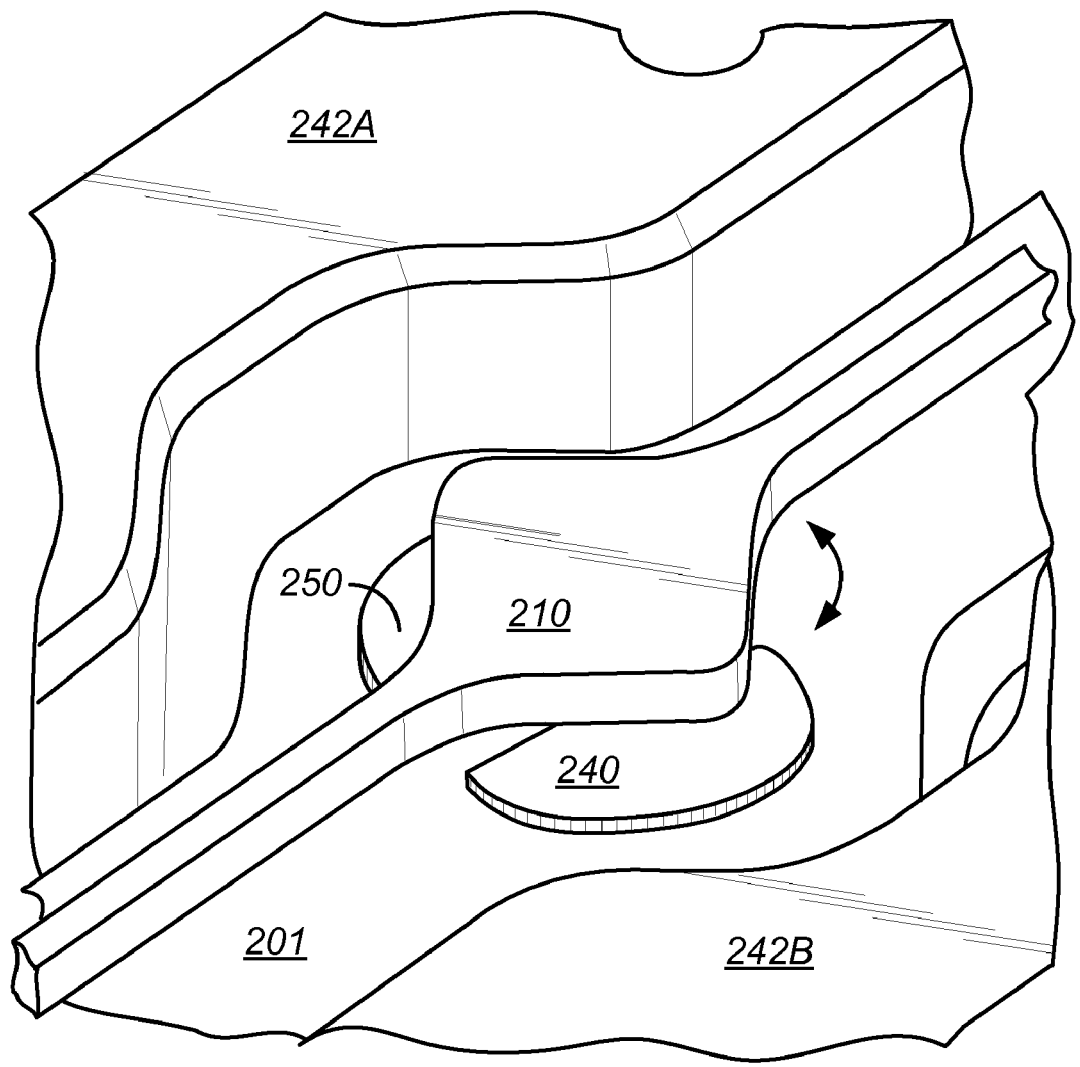
FIG. 3C is a simplified illustration of a portion of the silicon beam resonator illustrated in FIG. 2 operating in a rotational resonant mode.

FIG. 3C is a simplified illustration of a portion of the silicon beam resonator illustrated in FIG. 2 operating in a rotational resonant mode. Electrodes 240 and 250, which are driven out of phase from each other, are used to drive the resonator structure 210 in a rotational mode (torsional mode) as illustrated by the curved arrows to the right of the resonator structure 210 in FIG. 3C. In other embodiments, the phase of the voltages on the electrodes 240 and 250 is selected to provide for the desired rotational motion. Alternately attracting the sides of the resonator structure 210 toward or away from the drive electrodes, the rotational motion of the resonator structure is sensed using electrodes 242A and 242B. One of ordinary skill in the art would recognize many variations, modifications, and alternatives.

Figure 4A:
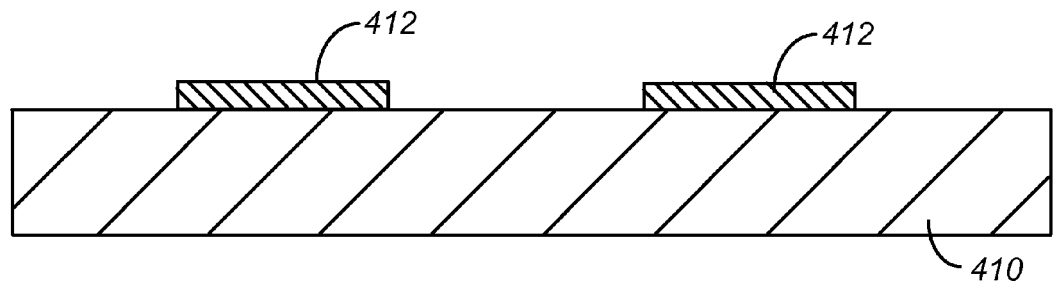
FIG. 4A-4L illustrate a simplified process flow for the fabrication of a MEMS resonator according to an embodiment of the present invention.

FIGS. 4A-4L illustrate a simplified process flow for the fabrication of a MEMS resonator according to an embodiment of the present invention. The process illustrated in FIGS. 4A-4L is merely an example of a process flow and is not intended to limit the scope of embodiments of the present invention. Referring to FIG. 4A, a CMOS substrate 410 is provided that includes a number of electrodes 412 disposed on a surface of the CMOS substrate. The electrodes are electrically connected to other circuitry (not shown) in the CMOS substrate. Other components of the CMOS substrate are not illustrated for purposes of clarity. In an embodiment, the CMOS substrate is a fully processed CMOS substrate. The CMOS substrate may include both logic and memory. One of ordinary skill in the art would recognize many variations, modifications, and alternatives.

In FIG. 4A, CMOS substrate 410 is illustrated after a via formation process. The illustrated electrodes 412 may be formed using a low temperature (e.g., less than 350° C.) PVD metal deposition process. Generally, the electrodes 412 are fabricated as a multi-layer metal stack such as 1,000 Å of titanium nitride (TiN), 8,000 Å of aluminum, and another 1,000 Å of TiN. Of course, in alternative embodiments, other suitable materials that conduct electricity and/or provide mechanical support for additional layers are utilized to form the electrodes 412. Patterning using photolithography and etching processes are utilized to pattern the electrodes 412 after deposition.

Figure 4B:
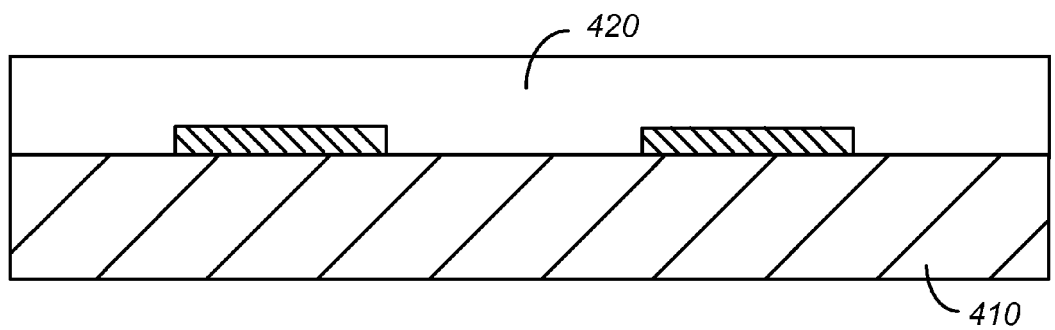

FIG. 4B illustrates the deposition and planarization of a dielectric layer 420 on the CMOS substrate 410. The dielectric layer may be formed from silicon oxide, silicon nitride, silicon oxynitride, combinations thereof, and the like. After deposition, the upper surface of the dielectric layer 420 may be planarized using, for example, a CMP process, to form a bonding surface characterized by a predetermined surface roughness. In an embodiment, the surface roughness is less than 5 Å RMS.

In a particular embodiment, a high density plasma (HDP) insulator deposition, planarization, and patterning process is utilized to fabricate the dielectric layer 420 illustrated in FIG. 4B. illustrated. In the illustrated embodiment, planarization is accomplished using a chemical mechanical polishing (CMP) process, although this is not required by the present invention. In the embodiment illustrated in FIG. 4B, the layer 420 is an oxide layer deposited using a low temperature (e.g., less than 350° C.) HDP process, although other layers that provide electrical insulation and mechanical support for additional layers are utilized in alternative embodiments. The electrodes 412 are illustrated as before and are covered by the oxide layer during the deposition process.

In an embodiment, layer 420 is fabricated from silicon oxide ($Si_xO_y$, e.g., $SiO_2$) but this is not required by the present invention. Other suitable materials may be used within the scope of the present invention. For example, layers fabricated from silicon nitride ($Si_xN_y$, e.g., $Si_3N_4$) are utilized in alternative embodiments. In yet other embodiments, silicon oxynitride (SiON) is used to fabricate layer 420. Moreover, polysilicon material, including amorphous polysilicon, is utilized in yet another alternative embodiment according to the present invention. Combinations of such materials may be used to form a composite layer. Materials with suitable characteristics, including formation of a strong bond with underlying layers, good adhesion to CMOS substrate 110, and mechanical rigidity, are acceptable substitutes for the silicon oxide material illustrated in FIG. 4B.

Moreover, in some embodiments of the present invention, the process used to deposit the layer or layers from which layer 420 is fabricated is performed in light of the structures associated with the device substrate. For example, some CMOS circuitry may be adversely impacted by performing high temperature deposition processes, as these high temperature deposition processes may damage metals (e.g., aluminum reflow) or result in diffusion of junctions associated with the CMOS circuitry. Thus, in a particular embodiment of the present invention, low temperature deposition, patterning, and etching processes, such as processes performed at temperatures of less than 500° C., are used to form layer 420. In another specific embodiment, deposition, patterning, and etching processes performed at less than 500° C., are used to form layer 420.

In a particular embodiment, layer 420, with a first predetermined thickness, is deposited on CMOS substrate 410. In a specific embodiment, the first thickness is about 2 μm. In other embodiments, the first thickness ranges from about 1.0 μm to about 3.0 μm. Of course, the thickness will depend on the particular applications. In some deposition processes, the upper surface of the deposited layer 420 is uniform across the substrate, resulting in a planar surface. However, a planar surface after deposition is not required by the present invention. In a particular deposition process, the patterned nature of the electrodes 412 results in the thickness of layer 420 varying as a function of lateral position, producing an upper surface that is not entirely flat.

To planarize the upper surface of the deposited layer 420, an optional CMP step is performed in an embodiment of the present invention. The results produced by the CMP process are illustrated by the upper surface of layer 420 as shown in FIG. 4B in which the thickness of layer 420 is a second thickness less than the first thickness. During the CMP process, material is removed, resulting in a highly polished and planarized layer of a second thickness. In a particular embodiment, the root-mean-square (RMS) roughness of the planarized surface is less than or equal to about 4 Å. As will be described below, the extremely smooth surface produced during the CMP process facilitates substrate bonding as shown in FIG. 4E. In embodiments according to the present invention, the second thickness of layer 420 is about 0.8 μm. Alternatively, the second thickness ranges from about 0.5 μm to about 2.5 μm in other embodiments. Of course, the thickness will depend upon the particular applications.

Figure 4C:
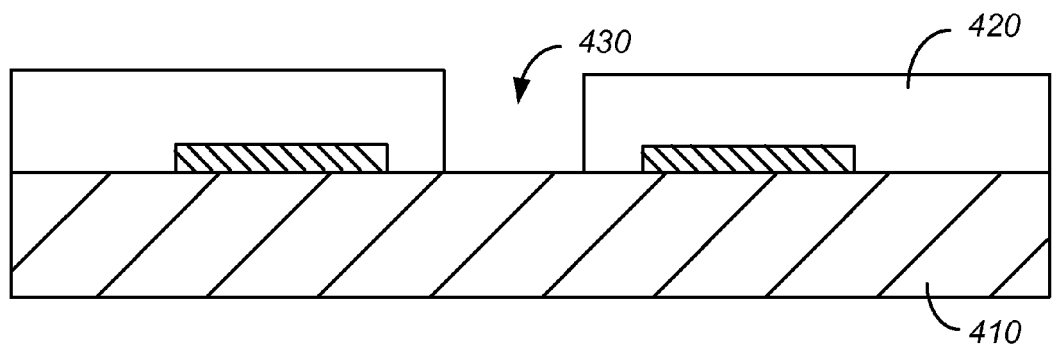

FIG. 4C illustrates the formation of cavity 430 in dielectric layer 420. The dimensions of the cavity are selected depending on the particular application as described more fully below. Referring to FIG. 4C, a cavity 430 is formed in layer 420 using a patterning and material removal process, such as etching. The cavity 430 extends from the upper surface of deposited layer 420 to the top of the CMOS substrate. The dimensions of the cavity are selected to provide a rotation space for the moveable portions of the MEMS resonator as described more fully below. Although not illustrated in FIG. 4C for purposes of clarity, additional cavities are formed at various portions of the CMOS substrate for other MEMS resonators fabricated using the same substrate.

The cavity 430 is characterized by a volume defined by the depth of the cavity, measured normal to the upper surface of layer 420 and the lateral area of the cavity. According to embodiments of the present invention, the surface area defined by the upper surface of layer 420 is greater than the combined lateral area of the cavity 430. The greater surface area provided by the upper surface of layer 420 compared to the lateral area of the cavity facilitates substrate bonding as discussed in relation to FIG. 4E since the bonding area is greater than the unbonded area. In a specific embodiment, the lateral area of the cavity is about 25 μm² for every 100 μm² of the surface of layer 420. Thus, the lateral area of the cavity ranges from a few percent to several tens of percent of the total original surface area of the upper surface of layer 420 prior to formation of the cavity and the bonding area extends over the majority of the surface area of layer 420. The bonding yield after a layer transfer process, which is related to the bonding area, is high in embodiments of the present invention as a result of these area ratios.

Figure 4D:
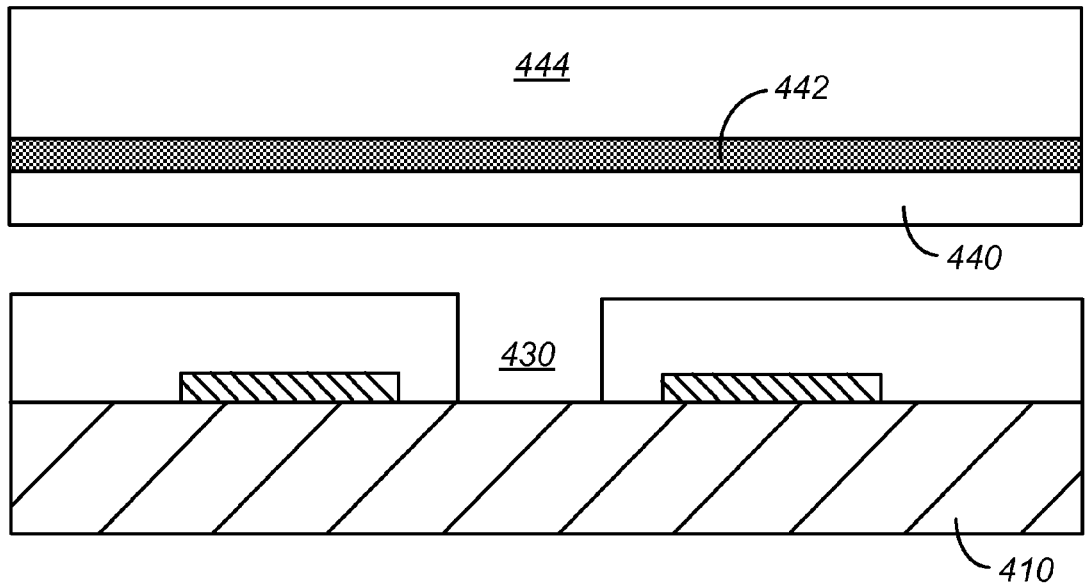
Figure 4E:
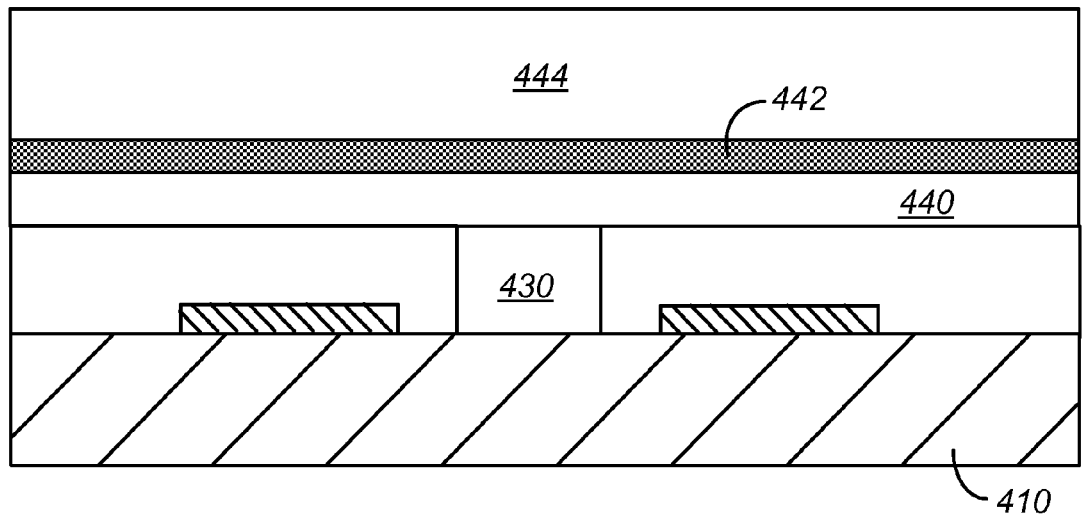

As another part of the fabrication process, a silicon-on-insulator (SOI) wafer is brought into physical proximity to the CMOS substrate as illustrated in FIG. 4D. The SOI wafer illustrated in FIG. 4D includes a single crystal silicon layer, an oxide layer, and a substrate layer. In alternative embodiments, other SOI substrates, which may include an implantation layer or other separation layer, are utilized. SOI substrates suitable for use in embodiments described herein are available from Soitec of Bernin, France, Silicon Genesis, Corporation, of San Jose, Calif., or MEMC Electronic Materials, Inc., of St. Peters, Mo.

In embodiments of the present invention, the layer transfer process illustrated, in part, by FIG. 4D, provides for various thicknesses of layer 440, depending on the particular applications. For example, for resonators that oscillate substantially in a direction perpendicular to the plane of layer 440, thickness for layer 440 are provided ranging from about 1.0 µm to about 0.1 µm. For such thin layers, sufficient flexibility is provided for the resonator structure to oscillate perpendicular to the plane of layer 440 in response to actuation by the corresponding electrode positioned lateral to or below the resonator structure. Another exemplary resonator structure utilizes resonator structures that oscillate in a direction substantially parallel to the plane of layer 440. For such exemplary resonators, thicknesses of layer 440 typically range from about 1.0 µm to about 10.0 µm.

FIG. 4E illustrates a wafer bonding process in which the SOI wafer is bonded to the CMOS substrate. The bonding process in some embodiments is a low temperature process adapted to preserve the integrated circuits on the CMOS substrate. As illustrated in FIG. 4E, the single crystal silicon layer 440 of the SOI wafer is bonded to the upper portion of the dielectric layer 420 during the substrate bonding process. Additional information related to the substrate bonding process is provided in U.S. Pat. No. 7,172,921, issued on Feb. 6, 2007, and entitled "Method and Structure for Forming an Integrated Spatial Light Modulator," which is commonly assigned and is hereby incorporated by reference for all purposes.

Substrate bonding can occur using a variety of techniques. In a specific embodiment, the bonding occurs using a room temperature covalent bonding process that results in the formation of a chemical bond at the bonding interface. Such low temperature bonding processes maintain the structural and electrical integrity of the CMOS substrate. Each of the faces is cleaned and activated, e.g., by plasma activation, wet processing, or the like. The activated surfaces are brought in contact with each other to cause a sticking action. In some bonding processes, mechanical force is provided on each substrate structure to press the faces together. In embodiments in which layer 440 is silicon and layer 420 is silicon oxide, silicon bearing bonds are created between the two faces. In alternative embodiments, an oxide layer is formed on the upper surface of layer 420 prior to bonding to provide an oxide-oxide bond interface. The upper surface of layer 420 is polished by a CMP process in one embodiment while the bonding surface of layer 440 is polished as well, providing an extremely smooth surface that is conducive to covalent bonding processes. According to embodiments of the present invention, no intermediate bonding material (e.g., epoxy) is utilized during the substrate bonding process. Of course, one of ordinary skill in the art would recognize many other variations, modifications, and alternatives.

According to embodiments of the present invention, bonding techniques are utilized that provide interfaces characterized by a bonded area/total area ratio of greater than 10%. For example, the bonded area, characterized by an adhesion test, is greater than 10% of the surface area of the upper surface of layer 420. In other embodiments, the bonded area/total area ratio is greater than 50%. In yet other embodiments, the bonded area/total area ratio is greater than 80%. The increase in bonded area as a function of the total interface area will result in a stronger mechanical connection between the torsion spring hinge layer and the support structures coupled to the substrate.

As illustrated in FIG. 4E, a sealed cavity is formed in between the two substrates during the bonding process. As described more fully throughout the present specification, the cavity 430, which was previously formed using a lithography and etching process during the process illustrated in FIG. 4C, provides space for rotation of various elements of the MEMS resonator during operation. The CMOS substrate defines a lower bound of the cavity and the thickness of the oxide layer 420 defines the height of the cavity. Thus, the separation distance between portions of the CMOS substrate and the layer 440 is defined by the thickness of the dielectric layer 420.

According to some embodiments, a thin SOI substrate is used with a direct implant process used during a portion of the substrate bonding and thinning process. In some embodiments, no epitaxial process is used, providing lower cost and better uniformity for the single crystal silicon layer. In other embodiments, in order to increase the thickness of the single crystal silicon layer 440, epitaxial processes are utilized after the initial fabrication of the SOI wafer. Additionally, although FIG. 4D illustrates the use of an SOI wafer including a single crystal silicon layer 440, this is not required by embodiments of the present invention. For example, silicon layers including epitaxial polysilicon are included within the scope of the present invention. As discussed in relation to FIG. 4D, the thickness of layer 440, which may include one or more sub-layers formed by epitaxy, sputtering, or other deposition processes, is determined, in part, by the applications for the particular resonator. Accordingly, various thicknesses for layer 440 are provided by embodiments of the present invention, resulting in a flexible layer transfer process that is readily scaled to provide layer thicknesses appropriate for a variety of different devices. One of ordinary skill in the art would recognize many variations, modifications, and alternatives.

Figure 4F:
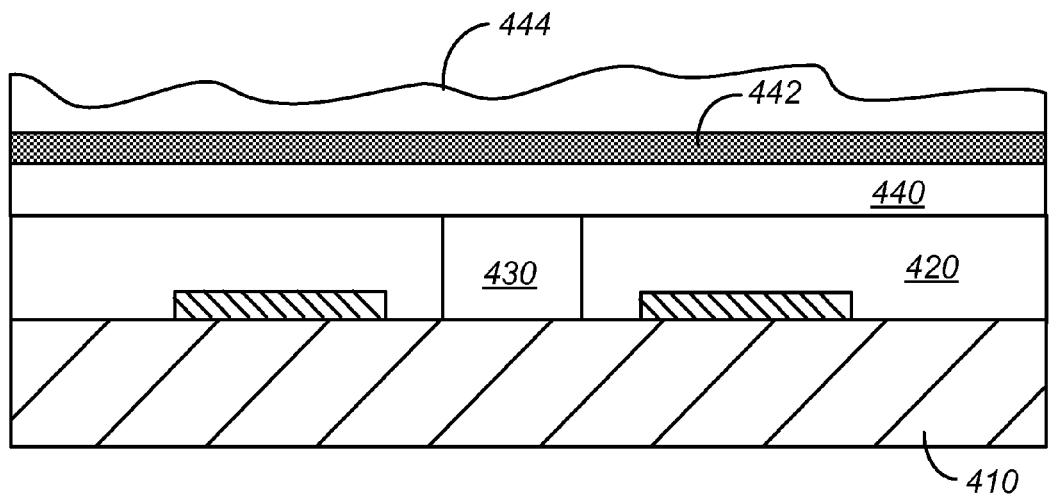
Figure 4G:
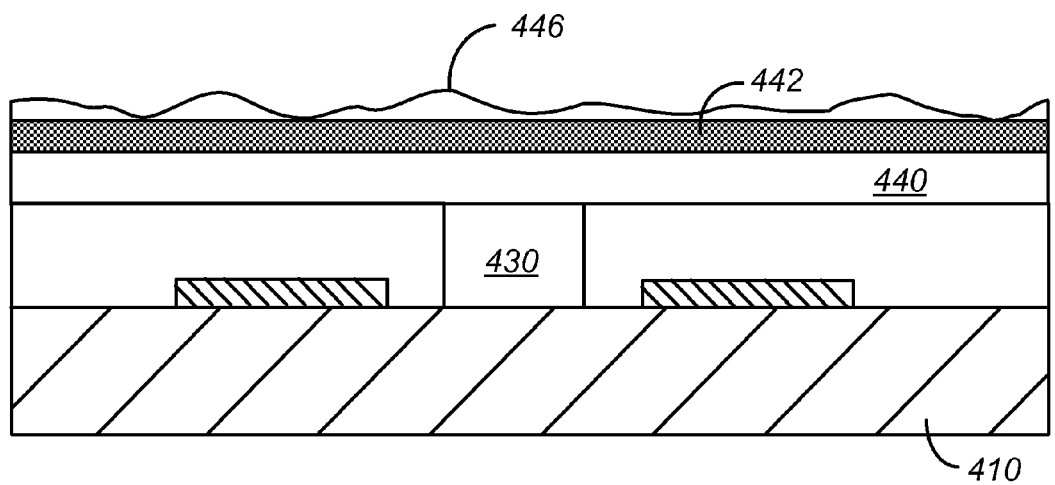
Figure 4H:
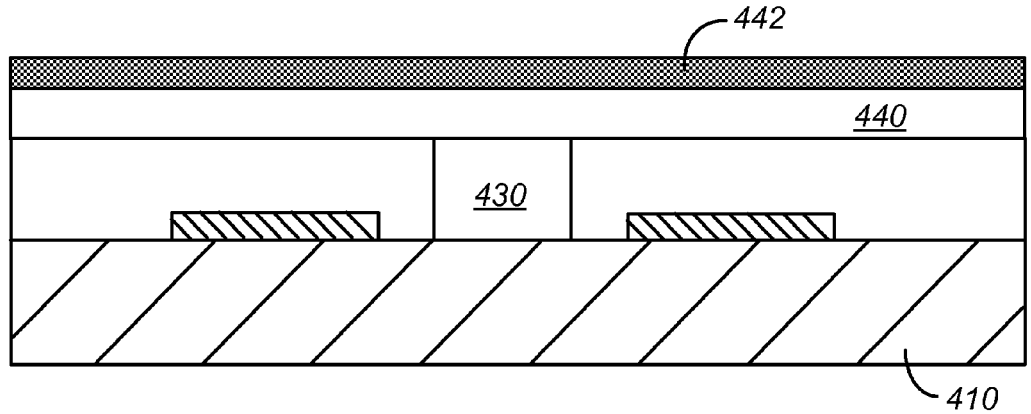

FIG. 4F and FIG. 4G illustrate two stages of a lapping, grinding, etching, or other thinning process in which the upper portion of the SOI wafer is removed. During grinding, a thickness variation typically results as illustrated in FIGS. 4F and 4G. In FIG. 4F, the thickness variation is associated with layer 444 and in FIG. 4G, the thickness variation is associated with layer 446. After the thinning processes illustrated in FIGS. 4F and 4G, the oxide layer 442 is exposed as illustrated in FIG. 4H. The removal of the portion of the SOI wafer above the oxide layer is completed using an etching process to expose the single crystal silicon layer 440 in the embodiment illustrated in FIG. 4I. Other material removal processes are utilized to expose the oxide layer and/or the single crystal silicon layer in other embodiments. One of ordinary skill in the art would recognize many variations, modifications, and alternatives. After the oxide layer is removed as illustrated in FIG. 4I to expose the single crystal silicon layer, additional fabrication processes can be used to fabricate the resonator structure as described more fully below.

Figure 4I:
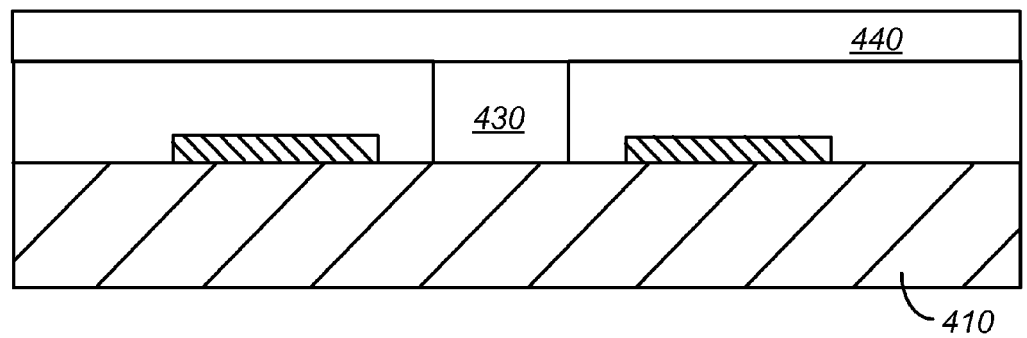

In other embodiments, wafers other than SOI wafers are utilized to provide a resonator layer (e.g., a single crystal silicon layer) bonded to a CMOS substrate as illustrated in FIG. 4I. For example, another process includes bonding a hydrogen-implanted silicon wafer to the CMOS substrate. A single crystal silicon layer is then cleaved from the silicon wafer after the bonding process to form the structure illustrated in FIG. 4I. One of ordinary skill in the art would recognize many variations, modifications, and alternatives.

Figure 4J:
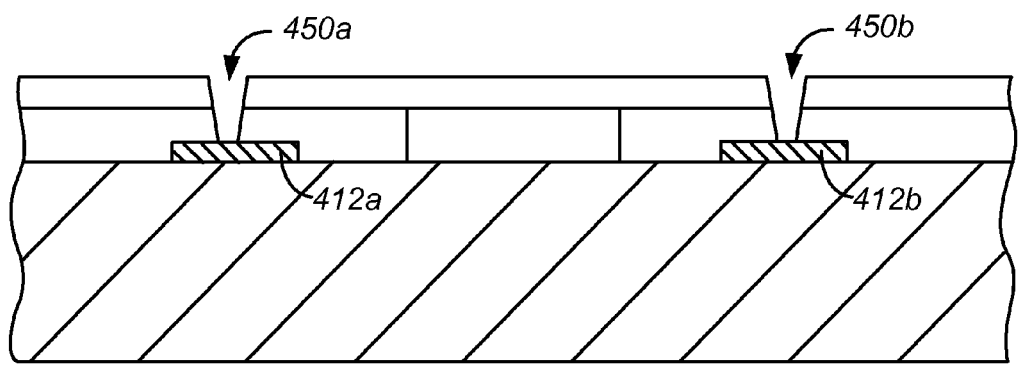

Via holes are etched through the single crystal silicon layer and the dielectric layer as illustrated in FIG. 4J. A portion of the electrodes 412 are exposed during this process. As shown in FIG. 4J, vias 450a and 450b are etched to provide a path for electrical contact between various layers of the structure. For example, via 450a is a via providing an electrical connection between the electrode 412a and a drive electrode (not shown) that is fabricated in subsequent processing steps. In a similar manner, via 450b is a via providing an electrical connection between electrode 412b and a sense electrode (not shown). Additional description of the geometry and placement of the vias is provided below. Generally a two-step etch process is utilized to etch through the silicon layer 440 and the dielectric layer 420, terminating on the upper surface of the metal-4 layer forming the electrodes 412. The cross-sectional profile of the vias is generally tapered, with a larger area at the top of the via than at the bottom of the via. Utilizing such a tapered via, PVD processes provide a layer of continuous material in subsequent deposition processes.

Figure 4K:
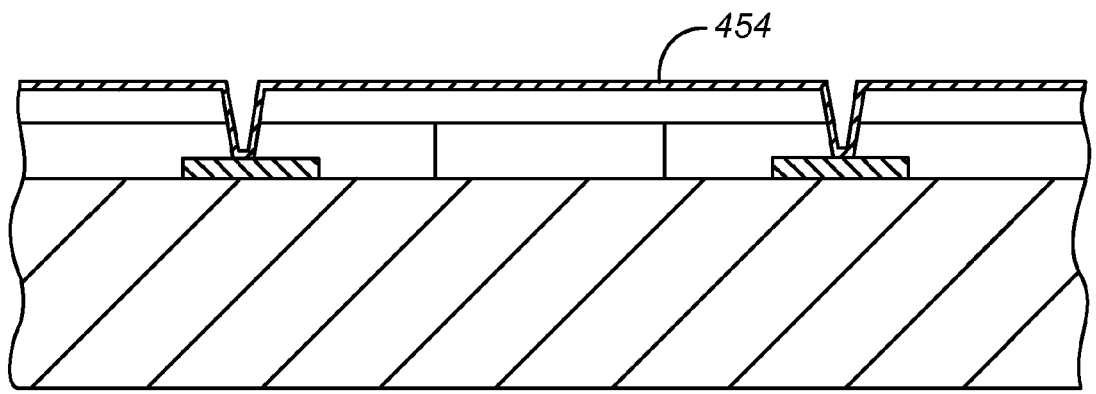

FIG. 4K illustrates the formation of a metal layer 454 (e.g., using a deposition process) to provide electrical contact between the upper surface of the single crystal silicon layer and the electrodes. In some embodiments of the present invention, a low temperature (less than 350° C.) chemical vapor deposition (CVD) process is utilized to deposit a conformal titanium layer that provides via step coverage and electrically connects the upper surface of the single crystal silicon layer 440 and the electrodes 412. Thus, electrical connectivity between the silicon and the electrode is provided. The metal layer 454 may be fabricated from suitable conductive materials, including Al, Ti, TiN, TiW, combinations thereof, and the like. Other via plug formation processes are utilized in alternative embodiments to provide a structure similar to that illustrated in FIG. 4K. One of ordinary skill in the art would recognize many variations, modifications, and alternatives.

In addition to the design illustrated in FIG. 4K, alternative embodiments utilize doping of the silicon layer 440 to provide electrode functionality. Yet other alternative embodiments utilize a combination of both doping and electrical contacts as illustrated in FIG. 4K. Accordingly, combinations of electrical conductors are utilized to conduct current from the metal electrodes 412 formed as part of the CMOS substrate and the electrodes 460 and 462.

Figure 4L:
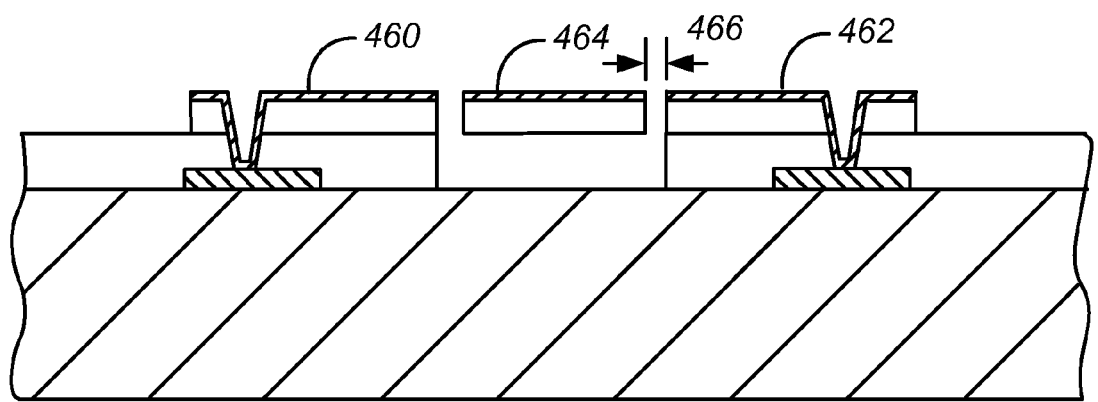

FIG. 4L illustrates the patterning of the metal and silicon layers to form one or more electrode structures and one or more moveable structures. Referring to FIG. 4L, a drive electrode 460 and a sense electrode 462 are provided on either side of a moveable structure 464, which is mechanically coupled to the CMOS substrate using flexible members (not shown). In order to fabricate the structures illustrated in FIG. 4L, portions of the wafer are masked using a lithography process and etched using an etching process appropriate for metal, silicon, and dielectric materials. Of course, other removal processes are included within the scope of the present invention. According to embodiments of the present invention, the fabrication of the moveable structure 464 from a single crystal silicon member provides numerous benefits, including high reliability.

In a particular embodiment of the present invention, the definition of the structures illustrated in FIG. 4L are separated into two or more lithography/etch processes. For example, a moveable structure definition etch includes patterning using deep-ultraviolet (DUV) lithography that provides critical dimensions of about 0.18 μm while the drive and sense electrode patterning etch includes patterning using i-line lithography that provides critical dimensions of about 0.6 μm. In other embodiments, critical dimensions of about 0.1 μm are provided by the processing steps utilized during fabrication. Thus, although illustrated as a single process in FIG. 4L, multiple lithography and etching steps characterized by different resolutions are utilized in some embodiments to reduce processing costs while providing desired uniformity and control. Utilizing these embodiments of the present invention, the gap 466 between the moveable structure 464 and the electrodes 460/462 can be fabricated depending on various factors including desired process time, desired critical dimension, and the like.

It should be noted that in some embodiments, the dimensions or gaps between the resonator structure and the electrodes (such as 466 laterally and the thickness of the dielectric layer 420 vertically) are determined as a function of the resonant modes of operation of the various system components. For operation in resonant modes for which the resonator structure moves vertically, the vertical gap between the resonator structure and the electrodes is a predetermined value depending on the particular resonant system. Thus, the thickness of the various layers as well as the separation distance between layer 440 and the CMOS substrate, which is a function of the thickness of dielectric layer 420, is selected as part of the system design. In some applications, this vertical gap is sub-micron, while in other applications, it may be up to several or tens of microns.

For operation in resonant modes for which the resonator structure moves laterally (i.e., in a direction substantially parallel to layer 440), the dimensions of the gaps 466 between the electrodes and the resonant structure measured in the plane of layer 440 are predetermined values to provide for oscillation of the moveable member 440 in the horizontal plane as well as for processing tolerances. For this mode of in which oscillation is parallel to layer 440, the gap 466 between the electrodes and the resonator structure is a predetermined value appropriate to provide desired voltage and capacitance for driving the resonator structure at the desired resonant frequencies. As an example, in some applications, the amplitude of the motion of the resonator structure in the plane of layer 440 is on the order of the scale of nanometers. Thus, sub-micron gaps between the resonator structure and the ends of the electrodes are appropriate for these applications.

It should be noted that in embodiments of the present invention, the CMOS structure is completed prior to fabrication of the MEMS resonator structures. Thus, the transistor layers in the CMOS substrate are disposed underneath the electrodes, which are disposed between the transistor layer and the resonator structure. The connection to the CMOS substrate is more easily performed than in some techniques in which CMOS elements are fabricated after the formation of the MEMS elements.

Figure 5:
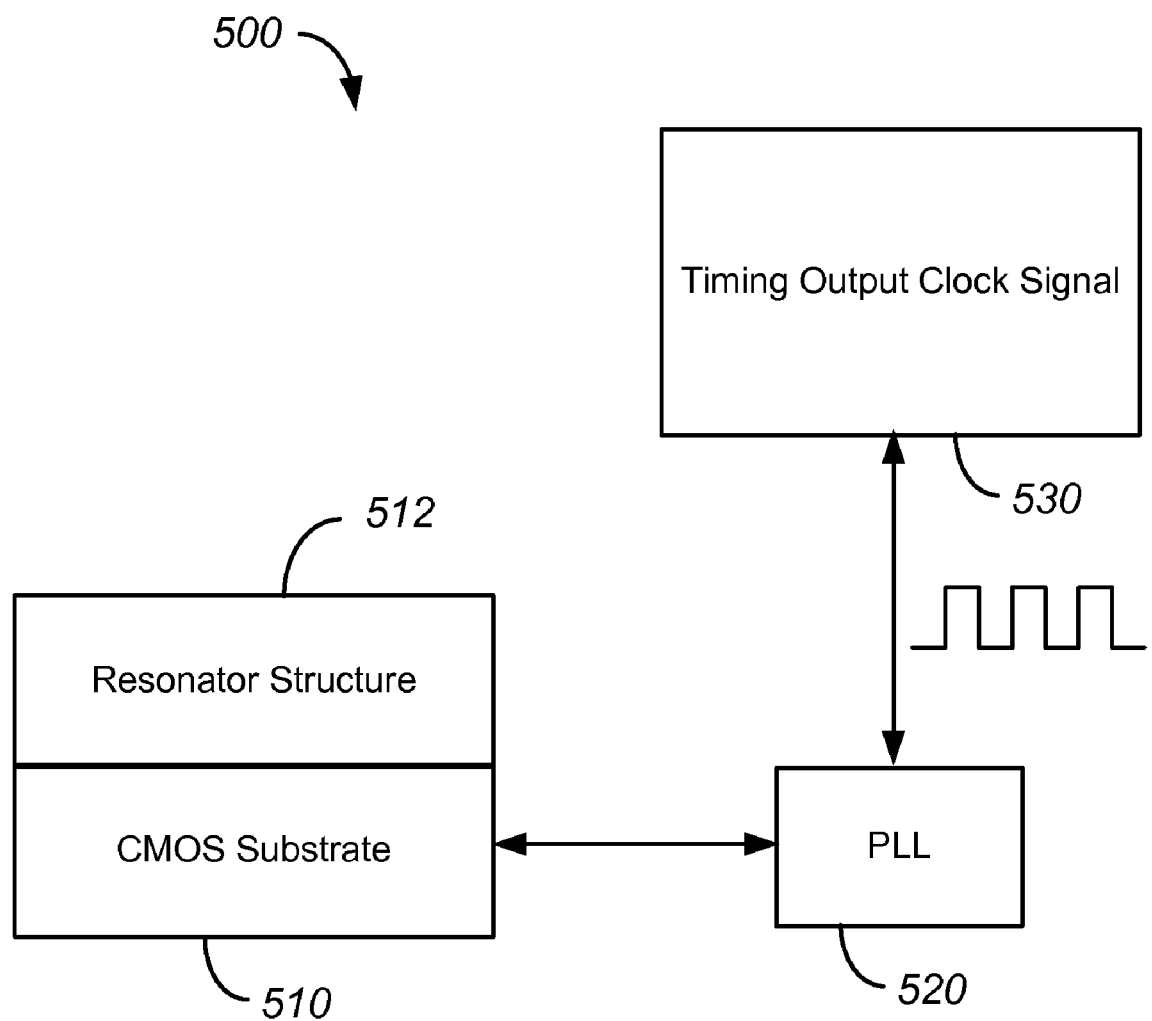
FIG. 5 is a simplified schematic illustration of a MEMS oscillator according to an embodiment of the present invention.

FIG. 5 is a simplified schematic illustration of a MEMS oscillator according to an embodiment of the present invention. The MEMS oscillator includes a MEMS resonator, which includes CMOS substrate 510 and resonator structure 512. As described above, resonator structure includes a moveable member (e.g., a moveable plate) coupled to the CMOS substrate through one or more springs or hinges as well as drive and sense electrodes, typically positioned on opposite sides of the moveable member. In a particular embodiment, the springs/hinges and the moveable member are all fabricated from a continuous piece of material provided by a silicon-containing layer.

Control signals provided by the CMOS substrate are electrically coupled to the drive electrode, which results in an oscillatory motion in the moveable structure. The motion of the moveable structure results, in turn, in an electrical signal at the sense electrode, which is electrically connected to the CMOS substrate. The electrical signal at the sense electrode is utilized to provide inputs to the PLL, which, in turn, is electrically coupled to the drive electrode. Thus, under computer control and/or utilizing inputs from the timing output clock signal 530, control and feedback is provided through the PLL 520 to operate the oscillator as appropriate to the particular applications.

Figure 6:
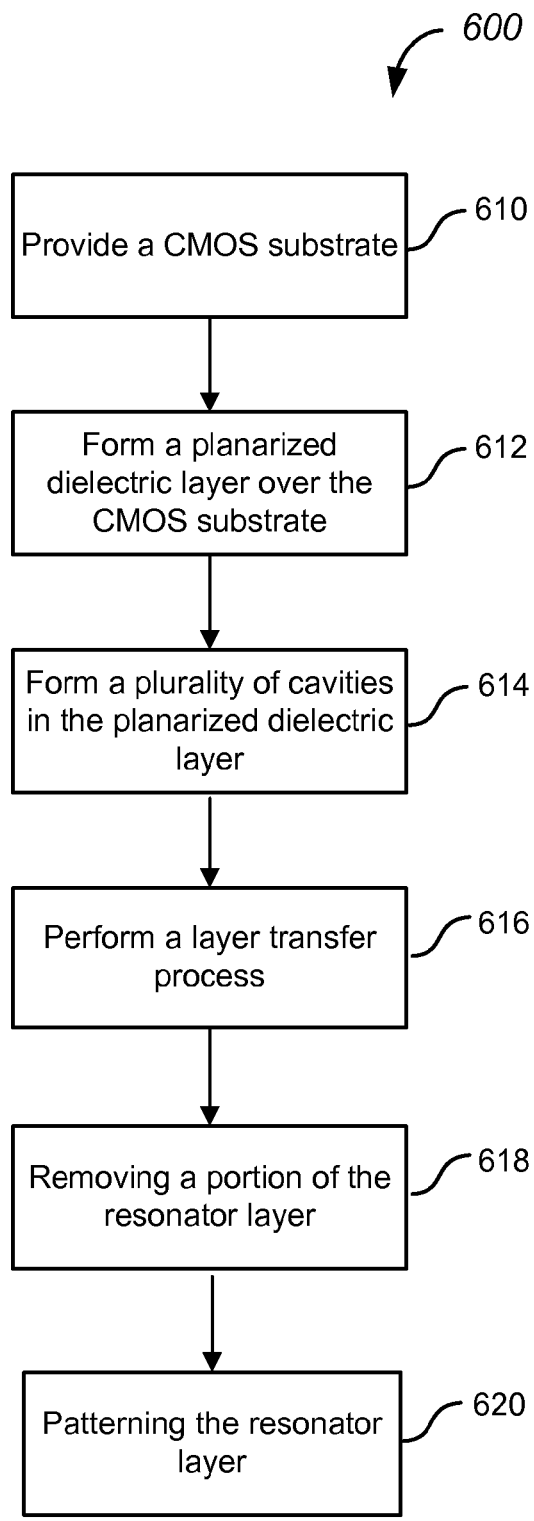
FIG. 6 is a simplified process flow for the fabrication of a MEMS resonator according to an embodiment of the present invention.

FIG. 6 is a simplified process flow for the fabrication of a MEMS resonator according to an embodiment of the present invention. The method 600 of fabricating a resonator device includes providing a CMOS substrate including at least one electrode 610. Typically, the CMOS substrate includes logic, memory, and/or other elements. In embodiments of the present invention, the fabrication of the CMOS substrate is completed prior to the fabrication processes described herein. Thus, embodiments of the present invention contrast with some techniques in which resonator structures are fabricated and then processing is performed to provide the functionality associated with the CMOS substrate. Accordingly, as described throughout the present specification and more particularly below, embodiments of the present invention provide a single crystal silicon resonator coupled to a completed CMOS substrate, with processing of the single crystal silicon resonator being performed in light of the circuitry present on the completed CMOS substrate.

A planarized dielectric layer is formed over or deposited on the CMOS substrate 612, typically utilizing a deposition process followed by a planarization process such as CMP. The CMP process is used to form a bonding surface that will be used in subsequently joining a resonator substrate to the CMOS substrate. A plurality of cavities are formed in the planarized dielectric layer 614 utilizing one or more lithography processes. A resonator substrate is joined to the CMOS substrate using a layer transfer process 616. In an embodiment, the layer transfer process is a wafer-level layer transfer process. In order to protect circuitry found on the CMOS substrate, the layer transfer process is performed in this embodiment by using low temperature bonding processes, that is, temperatures that do not adversely impact the circuitry previously formed on the CMOS substrate.

In some embodiments, the resonator substrate is an SOI substrate and the layer transfer process is performed utilizing the SOI substrate that includes a single crystal silicon layer. In other embodiments, the SOI substrate or wafer may include one or more epitaxial layers, thereby providing for layers with predetermined thickness and composition. As described throughout the present specification, the flexibility provided by the layer transfer process enables the fabrication of resonator structures operable at various resonant frequencies as appropriate to particular applications.

The method also includes removing a portion of the resonator substrate to provide a resonator layer 618 and patterning the resonator layer to form the resonator 620. As an example, removing a portion of the resonator substrate may include performing one or more processes including grinding, lapping, or other similar processes. As a result of these removal processes, a resonator layer is exposed for subsequent patterning. For example, in an embodiment, an etch back process is performed to expose a silicon layer present on the resonator substrate.

The above sequence of steps provides a method for fabricating a resonator device according to an embodiment of the present invention. As shown, the method uses a combination of steps including a way of forming movable micromechanical structures. Other alternatives can also be provided where steps are added, one or more steps are removed, or one or more steps are provided in a different sequence without departing from the scope of the claims herein. Further details of the present method can be found throughout the present specification.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method comprising:
providing a first substrate having an upper surface;
forming one or more electrodes overlying the first substrate;
forming a dielectric layer having a top surface and overlying the one or more electrodes;
forming a trench in the dielectric layer, the trench extending from the top surface of the dielectric layer to the upper surface of the first substrate;
providing a second substrate having a single crystal silicon layer;
bonding the second substrate to the first substrate, wherein the single crystal silicon layer makes contact with at least a portion of the dielectric layer;
thinning the second substrate to a predetermined thickness;
forming one or more vias extending from a top surface of the thinned second substrate to the one or more electrodes;
forming a metal layer over the top surface of the thinned second substrate;
patterning the metal layer to form a resonator layer; and
removing at least a portion of the resonator layer to form a resonator structure.

2. The method of claim 1 wherein a surface area defined by the top surface of the dielectric layer is greater than a combined lateral area of the trench.

3. The method of claim 1 wherein the first substrate comprises a CMOS substrate.

4. The method of claim 1 wherein the second substrate comprises a SOI substrate.

5. The method of claim 1 wherein the second substrate comprises a hydrogen-implanted silicon bearing substrate.

6. The method of claim 1 wherein bonding the second substrate to the first substrate comprises performing a room temperature bonding process.

7. The method of claim 1 wherein a ratio of bonded area to total area between the first substrate and the second substrate is greater than 10%.

8. The method of claim 1 wherein the vias provide electrical connectivity between a silicon bearing layer of the second substrate and the one or more electrodes disposed on the first substrate.

9. The method of claim 1 wherein patterning the metal layer comprises defining one or more electrode structures and one or more movable structures.

10. The method of claim 9 wherein a drive electrode and a sense electrode are provided on either side of a movable structure.

* * * * *